United States Patent
Oh et al.

(10) Patent No.: US 6,255,835 B1
(45) Date of Patent: Jul. 3, 2001

(54) CIRCUIT FOR TESTING OPTION OF A SEMICONDUCTOR MEMORY DEVICE

(75) Inventors: Young Nam Oh, Kyungki-Do (KR); Jin Yong Chung, Los Altos Hills, CA (US)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/342,179

(22) Filed: Jun. 29, 1999

(30) Foreign Application Priority Data

Jun. 29, 1998 (KR) .................................................. 98-24830

(51) Int. Cl.[7] .................................................. G01R 31/28
(52) U.S. Cl. .......................... 324/763; 324/765; 365/201; 714/733
(58) Field of Search .................................... 324/763, 765; 365/96, 201; 714/733, 734

(56) References Cited

U.S. PATENT DOCUMENTS

| | | | |
|---|---|---|---|
| 4,398,146 | * 8/1983 | Draheim et al. | 324/765 |
| 4,743,841 | * 5/1988 | Takeuchi | 324/763 |
| 5,257,225 | 10/1993 | Lee | 365/96 |
| 5,301,143 | * 4/1994 | Ohri et al. | 365/96 |
| 5,311,476 | 5/1994 | Kajimoto et al. | 365/222 |
| 5,345,413 | 9/1994 | Fisher et al. | 365/96 |
| 5,361,003 | 11/1994 | Roberts | 326/21 |
| 5,402,390 | 3/1995 | Ho et al. | 365/201 |
| 5,659,510 | 8/1997 | Kwon et al. | 365/200 |
| 5,774,404 | 6/1998 | Eto | 365/222 |

FOREIGN PATENT DOCUMENTS

| | | |
|---|---|---|
| 63-64697 | 3/1988 | (JP) . |
| 9-91961 | 4/1997 | (JP) . |
| 10-199288 | 7/1998 | (JP) . |

* cited by examiner

Primary Examiner—Ernest Karlsen
(74) Attorney, Agent, or Firm—Pennie & Edmonds LLP

(57) ABSTRACT

There is disclosed an option function test apparatus of a semiconductor device including a function selecting means. The function selection means includes a fuse signal detecting section for sensing the state of fuse blowing, a pad signal detecting section for sensing the signal state on the probe pad for selecting its specification, which is consisted by incorporating extra probe chips into the existing probe card, and a global signal control section for receiving the output signals from said fuse signal detecting section and said pad signal detecting section to output different output signals based on its operation mode. Thus, the present invention can provide an outstanding effect of reducing additional test time and cost depending on the changes in function, since it allows a multifunction test of all of the specifications mounted on the on-chip in a wafer state.

6 Claims, 1 Drawing Sheet

CIRCUIT FOR TESTING OPTION OF A
SEMICONDUCTOR MEMORY DEVICE

BACKGROUND OF THE INVENTION

1. Field of the Invention

The invention relates generally to an option function test apparatus for a semiconductor memory device, and more particularly to an option function test apparatus for a semiconductor memory device which can test previously on-chip functions in a state of a wafer before when the functions are classified into each device' specifications, upon mass-production of the functions each mounted according to each device' specification.

2. Description of the Prior Art

Generally, an asynchronous memory device can be classified into an extended data output(EDO) mode, a fast page(FP) mode and a self refresh mode, wherein a function selector is used to discriminate the operation modes.

However, as the conventional semiconductor memory device cannot test previously all the functions already mounted, in a state of a wafer, before a process is proceeded according to the specification of a set operation mode, it usually employs fuse option or metal option, or bonding option etc. to selectively test the functions. However, in case of bonding option, though the conventional method can easily test the functions using the already-mounted multi-function check, there is a problem that it has to perform a bonding for selecting the specification before the testing, thus requiring an additional cost. The additional cost may include the cost related to lead frame or assembly.

Also, in case of fuse option, though the conventional method can easily test the functions using the already-mounted multifunction check, there is a problem that it has to perform a fuse blowing for selecting the specification before the testing, thus requiring an additional cost.

Similarly, in case of metal option, though the conventional method can easily test the functions using the already-mounted multifunction check, there is a problem that it requires an additional mask manufacturing for selecting the specification before the testing.

SUMMARY OF THE INVENTION

It is therefore an object of the present invention to provide an option function test apparatus for a semiconductor memory device comprising a function selection means which can test previously all the functions in a state of a wafer before a process is proceeded according to the specifications of operation mode each set such as a fuse option and a metal option, and a bonding option etc.

In order to accomplish the above object, the option functions test apparatus of a semiconductor device according to the present invention including a function selecting means, wherein the function selection means includes a fuse signal detecting section for sensing the state of fuse blowing, a pad signal detecting section for sensing the signal state on the probe pad for selecting its specification, which is consisted by incorporating extra probe chips into the existing probe card, and a global signal control section for receiving the output signals from said fuse signal detecting section and said pad signal detecting section to output different output signals based on its operation mode.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF PREFERRED EMBODIMENTS

Figure 1:
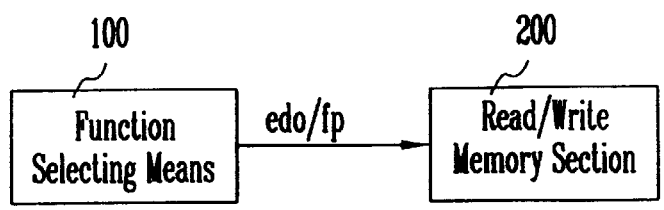
FIG. 1 shows a block diagram for illustrating an example of an option function test apparatus in a semiconductor device according to the present invention.

The present invention will be described in detail by way of a preferred embodiment with reference to accompanying drawings, in which like reference numerals are used to identify the same or similar parts.

Referring now to FIG. 1, there is shown a block diagram for illustrating an example of an option function test apparatus in a semiconductor device according to the present invention. The option function test apparatus includes a function selecting means 100 for determining the operation modes of all the functions by the bias voltage externally applied upon testing on the option functions for the products, and a read/write memory section 200 the specification of which is determined by the operation mode determined by the function selecting means.

Figure 2:
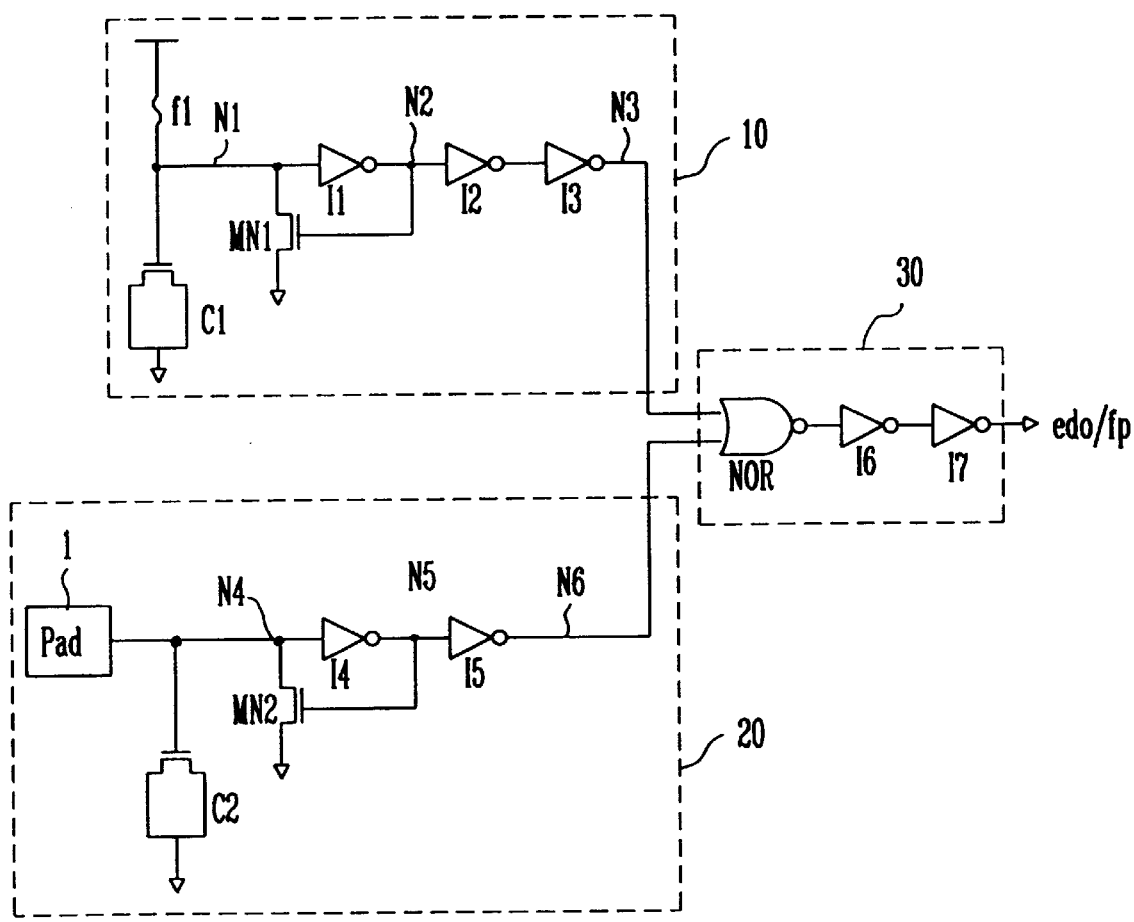
FIG. 2 is a circuit diagram for illustrating one embodiment of a function selecting means shown in FIG. 1.

Further, FIG. 2 shows a detailed circuit diagram for illustrating one embodiment of the function selecting means 100 shown in FIG. 1. The circuit includes a fuse signal detecting section 10 for sensing the state of fuse blowing, a pad signal detecting section 20 for sensing the signal state on the probe pad for selecting its specification,which is consisted by incorporating extra probe chips into the existing probe card, and a global signal control section 30 for receiving the output signals from the fuse signal detecting section 10 and the pad signaldetecting section 20 to output different output signals based on their operation modes.

The fuse signal detecting section 10 is consisted of a fuse f1 which be an anti-fuse connected between the supply voltage and the node N1, a capacitor C1 connected between the node N1 and the ground, an inverter I1 for inverting the potential of the node N1, a N-channel MOS transistor MN1 connected between the node N1 and the ground, the gate of which is applied the output signal from the inverter I1, and buffering elements I2, I3 for buffering/sending the output signal from the inverter I1.

Moreover, the pad signal detecting section 20 is consisted of a probe pad 1 for selecting the specification, which is consisted by incorporating extra probe chips into the existing probe card, a MOS capacitor C2 connected between the output terminal N4 of the probe pad 1 and the ground, an inverter I4 for inverting the signal from the output terminal N4 of the probe pad 1, a N-channel MOS transistor MN2 connected between the output terminal N4 of the probe pad 1 and the ground, the gate of which is applied the output signal from the inverter I4, and a buffering element I5 for buffering/sending the output signal from the inverter I4.

The global signal control section 30 is consisted of a NOR gate NOR for receiving the output signals from the fuse signal detecting section 10 and the pad signal detecting section 20 to logically combine the outputs, and buffering elements I6, I7 for buffering/sending the outputs from the NOR gate NOR.

Now, the operation of the circuit constructed as above according to the present invention will be explained below.

The fuse signal detecting section 10 buffers the voltage excited depending on the blowing state of the fuse f1 and then provide the buffered voltage to the final output terminal N3. The pad signal detecting section 30 also buffers the voltage applied to the probe pad 1 and then provides the buffered voltage to the final output terminal N6.

Further, the probe pad 1 requires extra probe chips to be incorporated into the probe card used to test the option function, and does not require the bonding in determining the final product.

The logical state of each of the above-mentioned function selecting means 100 can be represented as in the following Table 1.

TABLE 1

|  | N1 | N3 | N4 | N6 | edo/fp |
|---|---|---|---|---|---|
| Fuse is connected and a pad is floated. | 1 | 0 | 0 | 0 | 1 |
| Fuse is connected and a pad is at Low. | 1 | 0 | 0 | 0 | 1 |
| Fuse is connected and a pad is at High. | 1 | 0 | 1 | 1 | 0 |
| Fuse is blowing and a pad is floated. | 0 | 1 | 0 | 0 | 0 |
| Fuse is blowing and a pad is at Low. | 0 | 1 | 0 | 0 | 0 |
| Fuse is blowing and a pad is at high. | 0 | 1 | 1 | 1 | 0 |

In Table 1, 1 means a logic High and 0 means a logic Low. The specification of the final output signal edo/fp of the function selecting means 100 is determined at logic High upon EDO(extended data output) operation mode, and is determined at logic Low upon FP(fast page) operation mode.

According to the present invention, there is provided a function selection means 100 for determining the operation modes(EDO mode, FP mode) of the memory based on the output signal from the fuse signal detecting section 10 and the pad signal detecting section 20. Thus, it makes it possible to test the option function, thereby allowing previously selecting the operation mode of the multifunction before the wafer can be tested.

As mentioned above, the option function test apparatus in a semiconductor device according to the present invention can provide an outstanding effect of reducing the test time and cost upon mass production since it can test at once various functions mounted on the on-chip in the process before manufacturing of the product so that they can be divided into every specification.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

For example, the above mentioned fuse signal detecting section 10 may be implemented using an anti-fuse.

What is claimed is:

1. An option function test apparatus in a semiconductor device having a read/write memory section, the option function test apparatus including a function selection means connected to said read/write memory section, said function selection means comprising:

a fuse signal detecting section for sensing a state of fuse blowing, a pad signal detecting section for sensing an output of an associated probe pad, and a global signal control section for receiving output signals from said fuse signal detecting section and said pad signal detecting section, and outputting at least one control signal in response thereto, to thereby determine an operation mode of said semiconductor device.

2. The option function test apparatus in a semiconductor device as claimed in claim 1, wherein said fuse signal detecting section comprises:

a fuse connected between the supply voltage and a node, a capacitor connected between said node and ground, an inverter for inverting a potential of said node, a N-channel MOS transistor connected between said node and the ground with an output from the inverter being applied to a gate of said transistor, and at least one buffering element for buffering output from said inverter.

3. The option function test apparatus in a semiconductor device as claimed in claim 1, wherein the fuse within said fuse signal detecting section is an anti-fuse.

4. The option function test apparatus in a semiconductor device as claimed in claim 1, wherein said pad signal detecting section comprises:

a probe pad, a MOS capacitor connected between an output terminal of said probe pad and the ground, an inverter for inverting the signal from said output terminal of said probe pad, a N-channel MOS transistor connected between said output terminal of said probe pad and the ground with an output signal from the inverter being applied to a gate of said transistor, and at least one buffering element for buffering output from said inverter.

5. The option function test apparatus in a semiconductor device as claimed in claim 1, wherein said global signal control section comprises:

a logic element for logically combining output signals from said fuse signal detecting section and said pad signal detecting section and at least one buffering element for buffering output from said logic element.

6. The option function test apparatus in a semiconductor device as claimed in claim 5, wherein said logic element comprises a NOR gate.

* * * * *